United States Patent
Chang

(10) Patent No.: US 8,669,881 B2
(45) Date of Patent: Mar. 11, 2014

(54) CONTAINER DATA CENTER WITH EARTHQUAKE PROTECTION FUNCTION

(75) Inventor: Li-Wen Chang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 314 days.

(21) Appl. No.: 13/042,431

(22) Filed: Mar. 7, 2011

(65) Prior Publication Data

US 2012/0160719 A1     Jun. 28, 2012

(30) Foreign Application Priority Data

Dec. 24, 2010 (TW) ................................. 99145936 A

(51) Int. Cl.
*G08B 21/00* (2006.01)
(52) U.S. Cl.
USPC ...... 340/690; 340/691.3; 340/691.6; 340/691.1; 181/106; 181/108; 181/122; 367/14; 346/33 C; 73/1.85; 33/1 HH; 702/18; 382/109
(58) Field of Classification Search
USPC ........................................................ 340/690
See application file for complete search history.

(56) References Cited

U.S. PATENT DOCUMENTS 7,598,884 B2 * 10/2009 Lachenit et al. ............... 340/690
2010/0165565 A1 * 7/2010 Hellriegal et al. ....... 361/679.46

FOREIGN PATENT DOCUMENTS

| CN | 101085399 | 12/2007 |
|---|---|---|
| CN | 201414021 | 2/2010 |
| CN | 201491293 | 5/2010 |
| CN | 101777241 | 7/2010 |
| CN | 201607805 | 10/2010 |
| CN | 101777785 | 9/2012 |
| EP | 0940292 | 9/1999 |
| TW | 200510994 A | 3/2005 |
| TW | I250306 | 3/2006 |
| TW | 200813903 A | 3/2008 |

\* cited by examiner

*Primary Examiner* — George Bugg
*Assistant Examiner* — Anthony D Afrifa-Kyei
(74) *Attorney, Agent, or Firm* — Altis Law Group, Inc.

(57) ABSTRACT

A container data center includes a container, a plurality of power supplies, an electric switch system, a plurality of normally closed switches, an alarm device, and a controller. The electric switch system is received in the container. The plurality of normally closed switches are connected between the power supplies and the electric switch system. Each normally closed switch is connected with a corresponding one of the power supplies in series. The controller is connected to the normally closed switches and the alarm device, configured for receiving earthquake information containing an earthquake intensity, and configured for controlling the alarm device to activate alarms and controlling some of the normally closed switches or all the normally closed switches to open when the earthquake intensity is equal to or greater than a predetermined earthquake intensity.

3 Claims, 2 Drawing Sheets

CONTAINER DATA CENTER WITH EARTHQUAKE PROTECTION FUNCTION

BACKGROUND

1. Technical Field

The present disclosure relates to container data centers and, particularly, to a container data center which can avoid being damaged by short circuit when an earthquake occurs.

2. Description of Related Art

Container data centers, because of their portable nature, are seldom fixed securely in place, and thus are susceptible to swing even during minor earthquakes or other disturbances. If the container data center is still powered on at this time, the container data center may be damaged.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
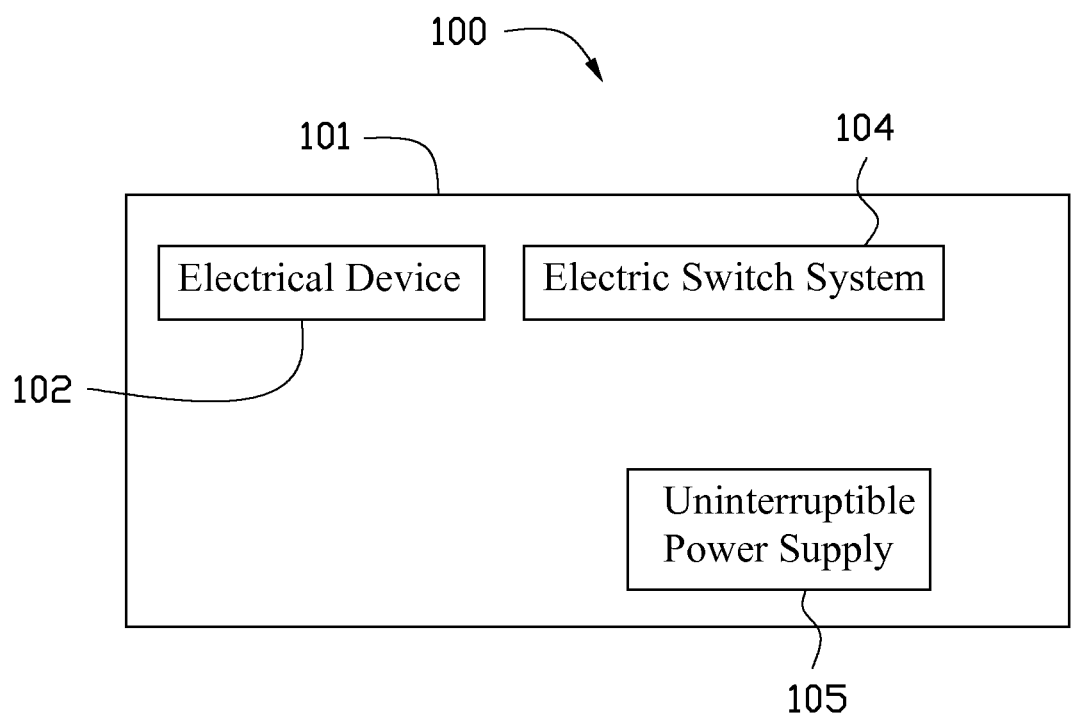
FIG. 1 is a schematic, top view of a container data center according to an embodiment.

Referring to FIG. 1, a container data center 100 according to an embodiment is disclosed. The container data center 100 includes a container 101 for receiving a plurality of electrical devices 102, an electric switch system 104, and an uninterruptible power supply (UPS) 105. The electric switch system 104 is electrically connected between the electrical devices 102 and the UPS 105.

Figure 2:
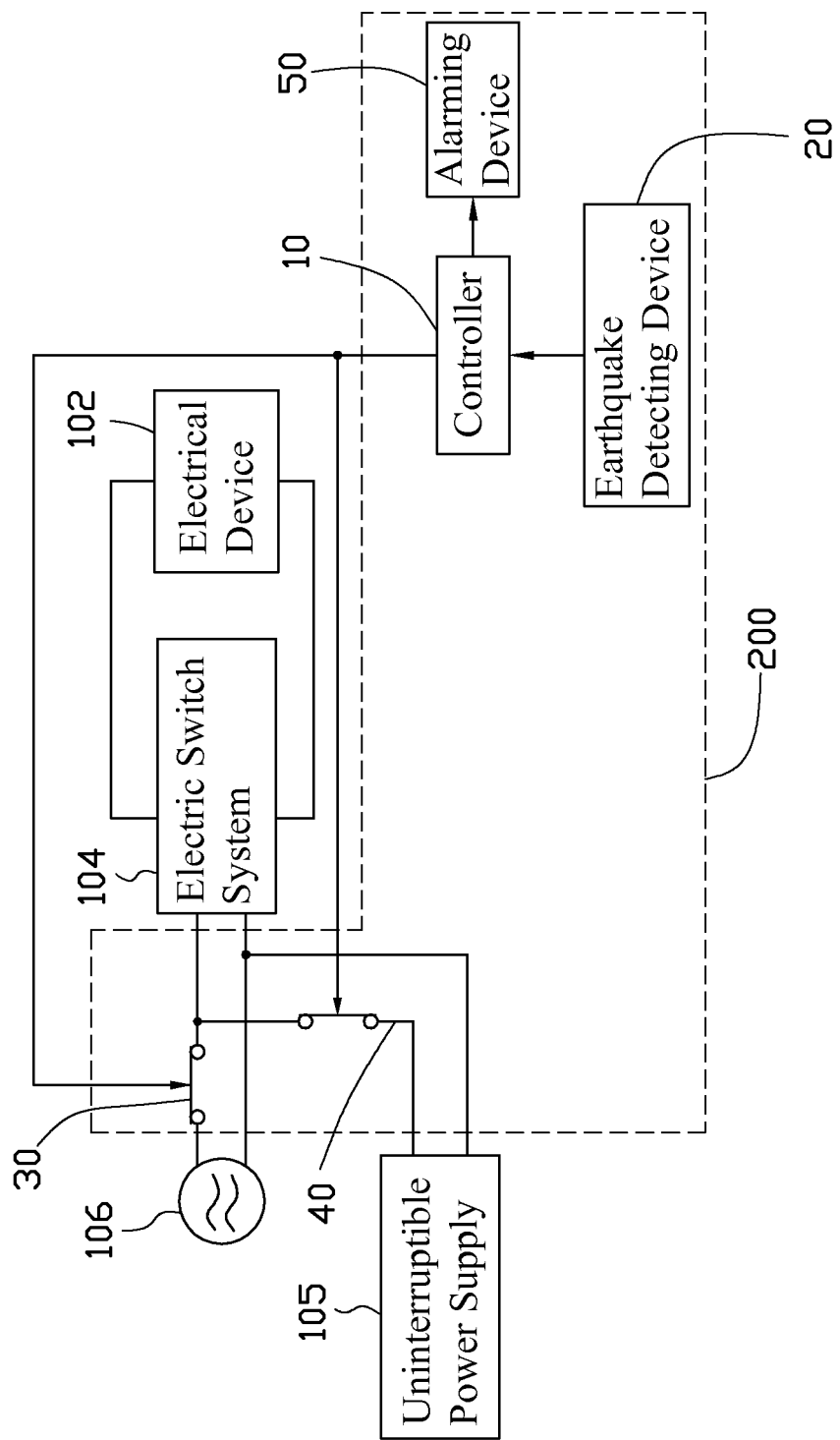
FIG. 2 is a circuit diagram of the container data center of FIG. 1.

Referring also to FIG. 2, a commercial power supply 106 and the UPS 105 are connected to an input end of the electric switch system 104 in parallel. The electrical devices 102 are connected in parallel to an output end of the switch system 104 to receive power. The UPS 105 supplies power to the electrical devices 102 when the commercial power supply 106 is shut down.

The container data center 100 further includes an earthquake protection system 200. The earthquake protection system 200 includes a controller 10 connected to an earthquake detecting device 20, a first switch 30, a second switch 40, and an alarm device 50. The first switch 30 and the second switch 40 are normally closed. The first switch 30 is connected between the commercial power supply 106 and the electric switch system 104 in series. The second switch 40 is connected between the UPS 105 and the electric switch system 104 in series.

The alarm device 50 is configured for activating audible and/or visual alarms, such as a flashing light and a siren, when the controller 10 sends an alarm instruction to the alarm device 50.

The earthquake detecting device 20 sends earthquake information to the controller 10 when an earthquake occurs. In this embodiment, the earthquake detecting device 20 is an earthquake intensity detecting device. The earthquake detecting device 20 obtains earthquake intensity by measuring the acceleration of the earthquake wave, and sends the earthquake information including the earthquake intensity to the controller 10. In this embodiment, the earthquake intensity is measured according to the Modified Mercalli Intensity scale. Generally speaking, when the earthquake intensity is equal to or lower than a IV, it is unlikely for any damage to occur to the data center; when the earthquake intensity is a V or VI, slight damage to the data center may occur; when the earthquake intensity is equal to or greater than a VII, serious damage to the data center is possible.

The controller 10 receives the earthquake information and determines the earthquake intensity. When the earthquake intensity is equal to or lower than a IV, the controller 10 will not respond to the earthquake information. When the earthquake intensity is a V or VI, the controller 10 controls the alarm device 50 to activate alarms, and opens the second switch 40 to shut off power from the UPS 105, to protect the UPS 105 from damage that can be caused by short circuiting should the data center shift or collapse in the earthquake. When the earthquake intensity is equal to or greater than a VII, the controller 10 controls the alarm device 50 to activate alarms, and opens the first switch 30 and the second switch 40. In this way, power from the commercial power supply 106 and the UPS 105 are both shut down and the container data center 100 is completed powered down to avoid being damaged by short circuiting.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A container data center comprising:

a container;

an electric switch system received in the container;

a commercial power supply and an uninterruptible power supply (UPS) connected to the electric switch system in parallel;

a plurality of normally closed switches comprising a first switch connected between the commercial power supply and the electric switch system in series and a second switch connected between the UPS and the electric switch system in series;

an alarm device; and a controller connected to the normally closed switches and the alarm device, configured for receiving earthquake information containing an earthquake intensity, and configured for controlling the alarm device to activate alarms and controlling some of the normally closed switches or all the normally closed switches to open when the earthquake intensity is equal to or greater than a predetermined earthquake intensity, wherein the earthquake intensity is measured according to the Modified Mercalli Intensity scale, when the earthquake intensity is equal to or lower than a IV, the controller does not respond to the earthquake information; when the earthquake intensity is a V or VI, the controller opens the second switch; and when the earthquake intensity is equal to or larger than a VII, the controller opens the first switch and the second switch.

2. The container data center of claim 1, further comprising an earthquake detecting device configured for sending the earthquake information to the controller when an earthquake occurs.

3. The container data center of claim 2, wherein the earthquake detecting device obtains the earthquake intensity by measuring the acceleration of earthquake wave.

* * * * *